(12) United States Patent
Orimo

(10) Patent No.: US 9,570,236 B2
(45) Date of Patent: Feb. 14, 2017

(54) ELECTRONIC COMPONENT AND METHOD FOR MANUFACTURING THE SAME

(71) Applicant: TAIYO YUDEN CO., LTD., Taito-ku, Tokyo (JP)

(72) Inventor: Hirokazu Orimo, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 142 days.

(21) Appl. No.: 14/374,471

(22) PCT Filed: Mar. 28, 2013

(86) PCT No.: PCT/JP2013/059183
§ 371 (c)(1),
(2) Date: Jul. 24, 2014

(87) PCT Pub. No.: WO2013/146979
PCT Pub. Date: Oct. 3, 2013

(65) Prior Publication Data
US 2015/0008026 A1    Jan. 8, 2015

(30) Foreign Application Priority Data

Mar. 29, 2012 (JP) ................................ 2012-075369

(51) Int. Cl.
*H01F 27/29* (2006.01)
*H01G 4/228* (2006.01)
(Continued)

(52) U.S. Cl.
CPC ................ *H01G 4/228* (2013.01); *H01G 2/06* (2013.01); *H01G 4/005* (2013.01); *H01G 4/232* (2013.01);
(Continued)

(58) Field of Classification Search
CPC ............ H01G 4/30; H01G 2/06; H01G 4/228; H01G 4/232; H01G 4/005; H05K 1/181; H05K 3/3426; H05K 3/3447; H05K 2201/0311; H05K 2201/10015; Y02P 70/613; H01C 1/148; H01C 7/1006; H01C 7/18
See application file for complete search history.

(56) References Cited

U.S. PATENT DOCUMENTS 5,398,166 A * 3/1995 Yonezawa ............... H05K 3/306
174/260
6,191,933 B1 * 2/2001 Ishigaki ................ H01G 4/232
361/309
(Continued)

FOREIGN PATENT DOCUMENTS

CN          1532860 A      9/2004
JP          06-005478 A    1/1994
(Continued)

OTHER PUBLICATIONS

International Preliminary Report on Patentability (PCT/IB/373) issued Oct. 1, 2014, with Translation of Written Opinion of the International Searching Authority (PCT/ISA/237), for corresponding international application PCT/JP2013/059183.
(Continued)

*Primary Examiner* — Hoa C Nguyen
(74) *Attorney, Agent, or Firm* — Law Office of Katsuhiro Arai

(57) ABSTRACT

An electronic component is provided with: an electronic component body including a top face, a bottom face, a pair of side faces, and a pair of end faces provided with an outside electrode; and a pair of metal terminals individually connected to the pair of outside electrodes of the electronic component body, wherein the metal terminals is electrically and mechanically connected to the outside electrode of the
(Continued)

electronic component body, and is also in contact with bottom face of the electronic component. The electronic component requires no jig or a simple jig if any for securing a metal terminal and electronic component body in place.

8 Claims, 3 Drawing Sheets

(51) Int. Cl.
| | |
|---|---|
| *H01G 4/30* | (2006.01) |
| *H01G 2/06* | (2006.01) |
| *H01G 4/232* | (2006.01) |
| *H01G 4/005* | (2006.01) |
| *H05K 1/18* | (2006.01) |
| *H05K 3/34* | (2006.01) |
| *H01C 1/148* | (2006.01) |
| *H01C 7/10* | (2006.01) |
| *H01C 7/18* | (2006.01) |

(52) U.S. Cl.
CPC ............... *H01G 4/30* (2013.01); *H05K 1/181* (2013.01); *H05K 3/3426* (2013.01); *H01C 1/148* (2013.01); *H01C 7/1006* (2013.01); *H01C 7/18* (2013.01); *H05K 3/3447* (2013.01); *H05K 2201/0311* (2013.01); *H05K 2201/10015* (2013.01); *Y02P 70/613* (2015.11)

(56) References Cited

U.S. PATENT DOCUMENTS

| 2004/0183147 A1* | 9/2004 | Togashi | H01G 2/065 |
| | | | 257/414 |
| 2010/0188798 A1 | 7/2010 | Togashi et al. | |
| 2013/0146347 A1* | 6/2013 | McConnell | H01G 4/30 |
| | | | 174/260 |

FOREIGN PATENT DOCUMENTS

| JP | H065473 A | 1/1994 |
| JP | 2002-231564 A | 8/2002 |
| JP | 2010-177370 A | 8/2010 |

OTHER PUBLICATIONS

A First Notification of Reason for Refusal issued by the State Intellectual Property Office of China, mailed Mar. 31, 2016, for Chinese counterpart application No. 2013800088393.
International Search Report (ISR) mailed Jul. 9, 2013, issued for international application No. PCT/JP2013/059183.

* cited by examiner

ELECTRONIC COMPONENT AND METHOD FOR MANUFACTURING THE SAME

This application is the U.S. National Phase under 35 U.S.C. §371 of International Application PCT/JP2013/059183, filed Mar. 28, 2013, which claims priority to Japanese Patent Application No. 2012-075369, filed Mar. 29, 2012. The International Application was published under PCT Article 21(2) in a language other than English.

TECHNICAL FIELD

The present invention relates to an electronic component and a method for manufacturing the same, and more specifically to a multi-layer ceramic capacitor (MLCC), multi-layer ceramic varistor or other surface-mounted electronic component soldered onto the mounting side of a circuit board, as well as a method for manufacturing the same.

BACKGROUND ART

Various types of surface-mounted electronic components are heretofore known, but when an electronic component is directly bonded onto the mounting side of a circuit board using paste-like bonding material (such as solder or brazing material), the high-temperature treatment involved may cause thermal expansion or thermal absorption on the mounting side of the circuit board and the resulting stress may damage the electronic component. When this happens, oftentimes the characteristics of the electronic component will drop.

Accordingly, a method has been used whereby multiple electronic components are layered to mitigate the stress generated by the circuit board as a result of thermal expansion or thermal contraction. In addition, use of a multi-layer ceramic capacitor, multi-layer ceramic varistor and other surface-mounted electronic components has become the mainstream approach today as an alternative to the aforementioned method. Examples of multi-layer ceramic capacitors can be found in Patent Literature 1 or the like.

The multi-layer ceramic capacitor described in Patent Literature 1 is structured in such a way that many internal electrodes are layered and placed in a ceramic dielectric element and then external electrodes connected to the internal electrodes are integrally provided on both ends of the element. According to this structure, directly bonding the external electrodes of the multi-layer ceramic capacitor onto the mounting side of the circuit board may cause the multi-layer ceramic capacitor element to crack when it receives stress from the circuit board. In light of the above, metal terminals are soldered onto the external electrodes and these metal terminals are used to absorb stress from the circuit board.

PRIOR ART LITERATURE

Patent Literature

Patent Literature 1: Japanese Patent Laid-open No. 2002-231564

SUMMARY OF THE INVENTION

Problems to be Solved by the Invention

However, in a multi-layer ceramic capacitor, multi-layer ceramic varistor or the like (hereinafter referred to as "electronic component"), the process of tentatively bonding the external electrodes on the electronic component element with the metal terminals using paste-like bonding material and then melting the bonding material at high temperature to firmly fix the external electrodes and metal terminals requires that the metal terminals be fixed with jigs to prevent dropout. In particular, blazing involves heat treatment at 500° C. or higher temperature and thus requires jigs made of expensive heat-resistant material. In addition, the structures needed to retain the metal terminals at specified positions are also complex and the members may deteriorate from repeated uses, and problems like these necessitate frequent replacement of the jigs, consequently pushing the manufacturing cost higher.

Accordingly, an object of the present invention is to provide an electronic component that does not require jigs to fix its metal terminals and electronic component element, or uses only simply structured jigs even if such jigs are required, as well as a method for manufacturing such electronic component.

Means for Solving the Problems

The present invention was proposed to achieve the aforementioned object, and the electronic component proposed by the present invention is an electronic component comprising: an electronic component element having a top face, a bottom face, a pair of side faces, and a pair of end faces as well as a pair of external electrodes provided on the pair of end faces; and a pair of metal terminals respectively connected to the pair of external electrodes on the electronic component element; wherein the metal terminal is constituted by: a lead terminal whose one end is electrically and mechanically connected to the external electrode on the electronic component element; and a horizontal part to which the other end of the lead terminal is connected and which also has a bottom contact part in contact with the bottom face of the electronic component element.

According to this constitution, the metal terminal is positioned on the electronic component element in such a way that one end of the lead terminal extending from the horizontal part of the metal terminal is electrically and mechanically connected to an end face of the electronic component element, while the horizontal part is contacting the bottom face of the electronic component element, and therefore manufacturing is possible by preventing the metal terminals from dropping out without requiring jigs to fix the metal terminals and electronic component element, or by using only simply structured jigs even if such jigs are required.

In addition, while one end of the lead terminal is electrically and mechanically connected to the external electrode on the electronic component element to form a rigid bond with the electronic component element, the horizontal part is only contacting the bottom face of the electronic component element and does not form a rigid bond. As a result, when impact is received from the mounting side of the circuit board, flexural deformation occurs between the lead terminal and circuit board, and this flexural deformation allows for absorption and mitigation of any disturbance stress received from the outside of the electronic component. Furthermore, absence of any rigid bond of the bottom face of the electronic component element with the mounting side of the circuit board assures mobility of the electronic component element with respect to the circuit board, and this assured mobility also helps absorb and mitigate any disturbance stress received from the outside of the electronic component.

In addition, preferably the lead terminal is constituted with a flexurally deformable lead part provided between its one end and other end as mentioned above.

According to this constitution, when impact is received from the mounting side of the circuit board, the stress absorption part provided between the one end and other end prevents the electronic component element from being damaged by actively absorbing and mitigating any disturbance stress received from the outside of the electronic component.

The method for manufacturing an electronic component as proposed by the present invention is a method for manufacturing an electronic component comprising an electronic component element having a top face, a bottom face, a pair of side faces and a pair of end faces on which external electrodes are provided, with metal terminals attached to the external electrodes, respectively; wherein the manufacturing method comprises, in this order: a step to prepare metal terminals, each bent and formed in at least an L shape and having a connection part on one bent end and a bottom contact part on the other end; a step to turn over the electronic component element so that the bottom face becomes an upper side and the top face becomes a lower side; a step to cause the bottom contact part of the metal terminal to contact the bottom face of the turned-over electronic component element, while tentatively bonding the connection part of the metal terminal to the end face using paste-like bonding material; and a step to heat the tentatively bonded part and melt the bonding material and then cool the part, thereby electrically and mechanically connecting the external electrode of the electronic component element and the connection part of the metal terminal.

According to this manufacturing method, the bottom face and top face of the electronic component element are reversed and the bottom contact part of the metal terminal bent in an L shape is placed on the bottom face now on top, and then the bottom contact part of the metal terminal comes onto the bottom face in a manner contacting the bottom face, while the connection part of the metal terminal contacts the external electrode and gets positioned in a manner tentatively bonded by paste-like bonding material. As a result, there is no need for jigs to fix the metal terminals and electronic component element, or even if such jigs are required, they can be those that are simply structured. In addition, heating the tentatively bonded part in this state of tentative bonding causes the bonding material to melt, which is followed by cooling to electrically and mechanically connect the external electrodes of the electronic component element with the connection parts of the metal terminals using the bonding material with ease.

Furthermore, the electronic component thus formed is such that one end of the lead terminal extending from the horizontal part of the metal terminal is electrically and mechanically bonded rigidly with the end face of the electronic component element, while the other end is only contacting and not rigidly bonded with the bottom face of the electronic component element, and therefore when impact is received from the mounting side of the circuit board, flexural deformation occurs between the lead terminal and circuit board and this flexural deformation allows for absorption and mitigation of any disturbance stress received from the outside of the electronic component. Moreover, absence of any rigid bond of the bottom face of the electronic component element with the mounting side of the circuit board assures mobility of the electronic component element with respect to the circuit board, and this assured mobility also helps absorb and mitigate any disturbance stress received from the outside of the electronic component.

In addition, preferably the metal terminal provided by this manufacturing method is formed in such a way that, when it is tentatively bonded onto the electronic component element, its center of gravity is on the bottom face of the electronic component element.

This way, when the bottom contact part of the metal terminal bent in an L shape is placed and tentatively bonded onto the bottom face of the turned-over electronic component element, its center of gravity is on the bottom face of the electronic component element and therefore the metal terminal is tentatively bonded more stably at a specified position on the electronic component element.

Effects of the Invention

According to the present invention, there is no need for jigs to fix the metal terminals and electronic component element, or even if such jigs are required, they can be those that are simply structured. In addition, since the metal terminals can be placed reliably and easily at specified positions on the electronic component element and connected electrically and mechanically in a stable manner, productivity will improve and manufacturing cost will drop, and therefore they can be provided at a low cost. Furthermore, when disturbance stress is received from the outside of the electronic component, the disturbance stress can be absorbed and mitigated by the lead terminal to prevent damage to the electronic component and thereby contribute to quality improvement.

BEST MODE FOR CARRYING OUT THE INVENTION

A mode for carrying out the present invention (hereinafter referred to as "embodiment") is explained in detail below based on the attached drawings. It should be noted that the present invention is not limited to the following embodiment and various modifications are permitted to the extent that they do not deviate from the key points of the present invention. Also, expressions indicating directions such as top/bottom and left/right are not absolute, but relative, and although they are appropriate when the respective parts of the electronic component under the present invention are in the positions described, they should be interpreted differently according to the changes in positions when the positions change. In addition, the bottom face is the surface facing the mounting side of the circuit board, and the surface on the opposite side of the bottom face is the top face. A mode for carrying out the present invention (hereinafter referred to as "embodiment") is explained in detail below by referring to the attached drawings.

Figure 1:
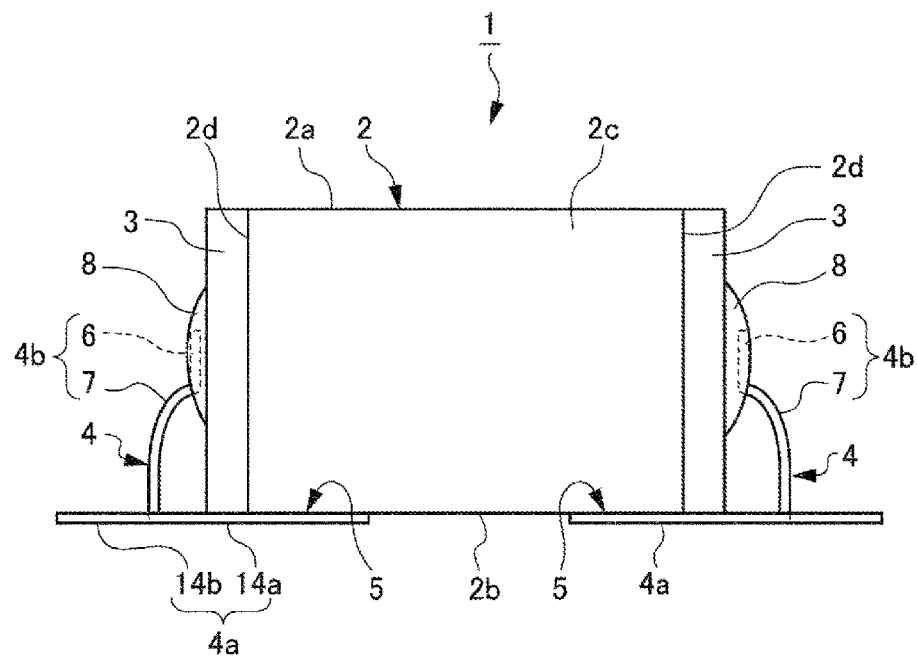
[FIG. 1] is a side view showing the basic constitution of an electronic component in an embodiment of the present invention.

FIG. 1 is a side view showing the basic constitution of an electronic component in an embodiment of the present invention. In this figure, an electronic component 1 is a multi-layer ceramic capacitor (MLCC), for example, and has an electronic component element 2 which is a ceramic dielectric shaped as a rectangular hexahedron having a top face 2a, a bottom face 2b, a pair of side faces 2c at front and rear, and a pair of end faces 2d on left and right. Although not illustrated, many internal electrodes are layered and placed inside the electronic component element 2. In addition, external electrodes 3 contacting the internal electrodes are provided integrally on the left and right end faces 2d of the electronic component element 2. Metal terminals 4 are attached to the electronic component element 2 in a manner electrically and mechanically connected to these external electrodes 3, respectively.

The metal terminal 4 is a metallic flat plate material made of copper or copper alloy offering good conductivity, or alloy 42 or Kovar whose linear expansion coefficient is close to that of ceramics, for example. The metal terminal 4 has a horizontal part 4a extending to the left and right, and a lead terminal 4b which is a bent part extending upward from the center of the horizontal part 4a. This metal terminal 4 may be press-formed as one piece from a single flat plate material, or the horizontal part 4a and lead terminal 4b may be formed separately and then integrated, but preferably it is press-formed as one piece.

Figure 2:
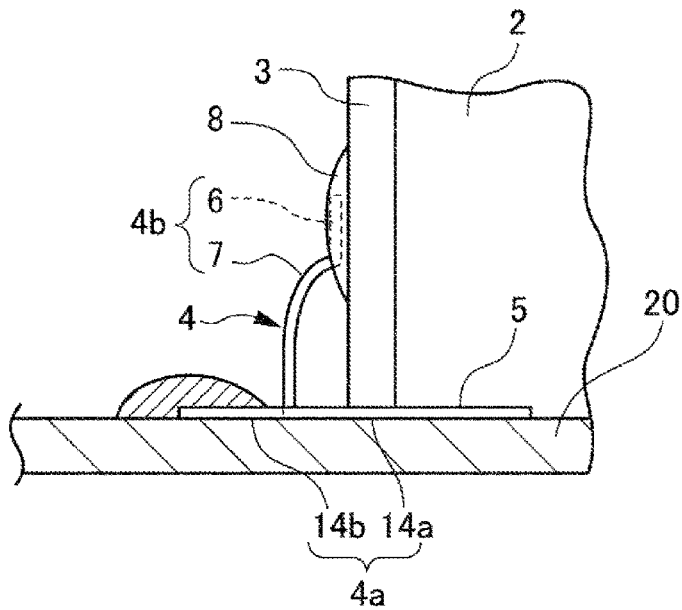
[FIG. 2] is a drawing explaining an example where the electronic component in an embodiment of the present invention is installed on the mounting side of the circuit board.
Figure 3:
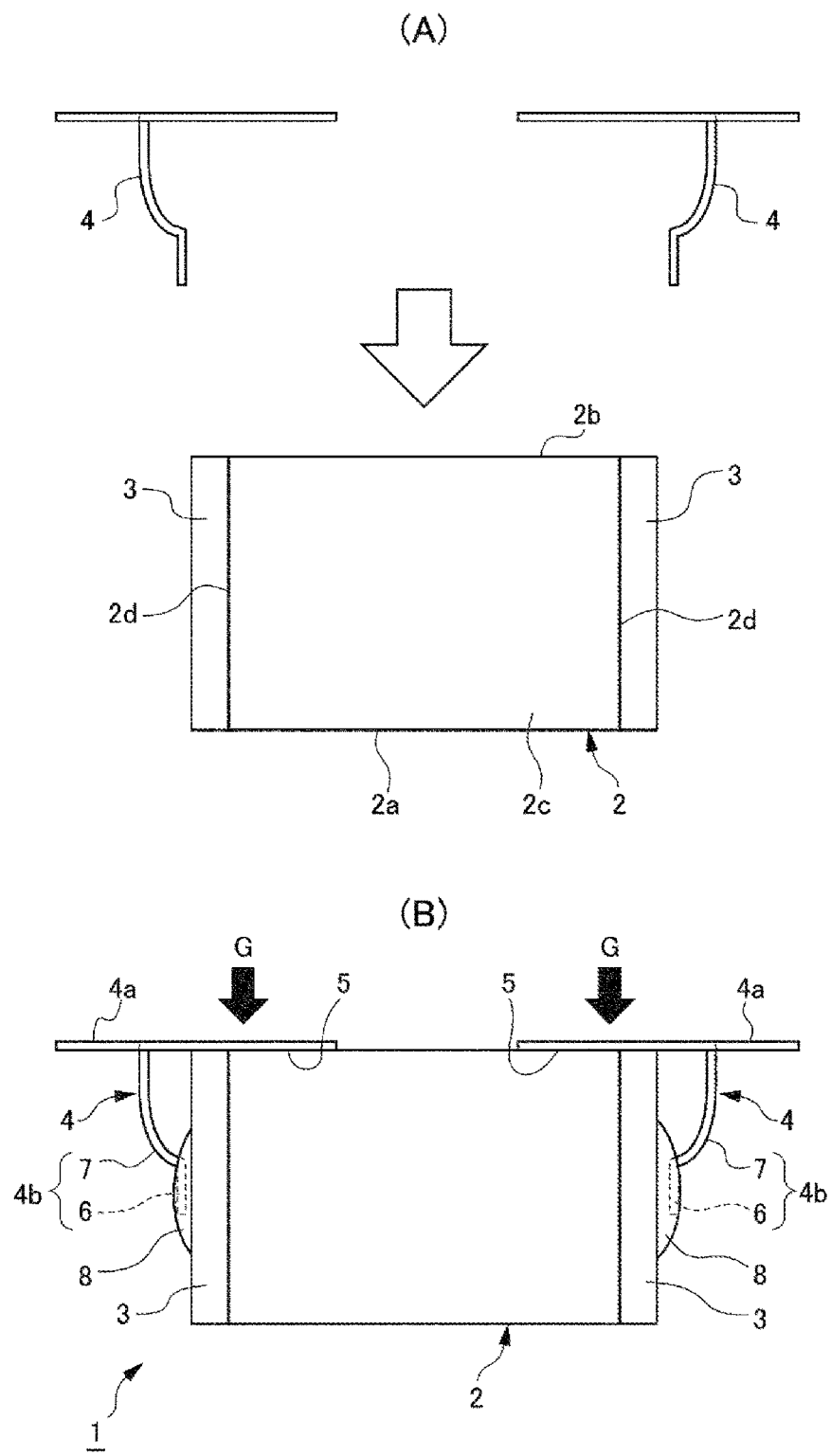
[FIG. 3] is a drawing explaining a method for manufacturing an electronic component in an embodiment of the present invention, where (A) is a side view explaining the steps up to the tentatively bonded state, while (B) is a side view explaining the steps from tentative bonding to melting and fixing.

Also, as shown in FIGS. 1 to 3, the horizontal part 4a of the metal terminal 4 is formed in such a way that the length from the connection part with the lead terminal 4b to the end on an inner part 14a is approximately three times longer than the length of an outer part 14b, and a part of the inner part 14a constitutes a bottom contact part 5 which is in contact with and placed on the bottom face 2b of the electronic component element 2. By making the length of the horizontal part 4a on the inner part 14a sufficiently longer than the length of the outer part 14b, the center of gravity G of the metal terminal 4 comes toward the inner part 14a, and consequently when the metal terminal 4 is placed on the bottom face 2b of the turned-over electronic component element 2, the center of gravity G of the metal terminal 4 is on the bottom face of the electronic component element 2, or specifically below the solid black arrow in FIG. 3 (B).

On the other hand, the vertical part 4b of the metal terminal 4 is formed in such a way that one end (base end) is fixed and connected to the horizontal part 4a, while the other end remains a free end. Also, a part of the lead terminal 4b on the free end side is formed as a connection part 6 positioned roughly in parallel with the surface of the external electrodes 3 provided on the end face 2d of the electronic component element 2, and furthermore the part between this connection part 6 and the aforementioned base end is formed as a lead 7 that can be bent to undergo flexural deformation.

Then, the metal terminal 4 thus formed is placed in such a way that the bottom contact part 5 of the horizontal part 4a is in contact with the bottom face 2b of the electronic component element 2, while the connection part 6 of the lead terminal 4b is in contact with the external electrode 3 of the electronic component element 2, and then attached to the electronic component element 2 with the connection part 6 and external electrode 3 fixed electrically and mechanically using bonding material 8, and assembled as the electronic component 1 as shown in FIG. 1.

Also, this electronic component 1 is such that, as shown in FIG. 2, the horizontal part 4a of the metal terminal 4 is placed on the mounting side of a circuit board 20 and mounted on the circuit board 20 with the outer part 14b of this horizontal part 4a fixed onto the mounting side by solder, brazing material, or other bonding material 8.

Accordingly, when the electronic component 1 thus constituted is manufactured, the metal terminal 4 is positioned on the electronic component element 2 in such a way that the connection part 6, which is the one end of the metal terminal 4, is placed in connection with the external electrode 3 provided on the end face 2d of the electronic component element 2, while the bottom contact part 5, which is the other end, is contacting the bottom face 2b of the electronic component element 2, and this makes production easy because there is no need for jigs to fix the metal terminals 4 and electronic component element 2 during manufacturing, and even if jigs are required, simply structured ones can be used to hold them at specified positions.

In addition, while the connection part 6 of the metal terminal 4 is electrically and mechanically connected to the external electrode 3 of the electronic component element 2 and bonded rigidly with the electronic component element 2, the bottom contact part 5 is only contacting the bottom face 2b of the electronic component element 2 and not bonded rigidly. And, since the metal terminal 4 is a metallic flat plate material and softer than the electronic component element 2, flexural deformation occurs between the connection part 6 and circuit board 20 when impact is received from the mounting side of the circuit board 20, and this flexural deformation allows for absorption and mitigation of any disturbance stress received from the outside of the electronic component 1. In addition, the lead terminal 4b has the flexurally deformable lead 7 provided on it by bending the part between the connection part 6 and horizontal part 4a (base end), which helps absorb and mitigate the disturbance stress further.

Moreover, the bottom face 2b of the electronic component element 2 is not bonded rigidly with the mounting side of the circuit board 20 and thus its mobility with respect to the circuit board 20 can be assured, and this assures mobility also helps absorb and mitigate any disturbance stress received from the outside of the electronic component 1, to prevent damage to the electronic component.

FIG. 3 is a drawing showing an example of how the aforementioned electronic component 1 pertaining to the present invention is manufactured. This manufacturing method is explained in the order from step (1) to step (4) using FIG. 3.

First, in step (1), the aforementioned metal terminals 4 and electronic component element 2 are prepared as shown in FIG. 3 (A).

Also, in step (2), the electronic component element 2 is turned over so that its bottom face 2b comes to the top and top face 2a comes to the bottom, as shown in FIG. 3 (A).

Next, in step (3), the metal terminals 4 are each placed on the electronic component element 2 in such a way that the bottom contact part 5 of the metal terminal 4 contacts the bottom face 2b of the turned-over electronic component element 2, while the connection part 6 of the metal terminal 4 contacts the external electrode 3 (end face 2d) with paste-like bonding material 8 applied in between, and then each metal terminal 4 thus placed is tentatively bonded onto the electronic component element 2. At this time, the horizontal part 4a of the metal terminal 4 is formed in such a way that the length of the inner part 14a is approximately three times longer than the length of the outer part 14b and, as shown in FIG. 3 (B), the center of gravity G of the metal terminal 4 as a whole is placed on the bottom face 2b of the electronic component element 2. As a result, the metal terminal 4 placed on the electronic component element 2 is placed stably on the bottom face 2b without using any positioning or fixing jig in particular.

Next, in step (4), bonding material 8 that provides tentative bonding is heated and this bonding material 8 is melted and then cooled. As a result, the bottom contact part 5 and the bottom face 2b of the electronic component element 2 are only in contact with each other, while the external electrode 3 (end face 2d) of the electronic component element 2 and the contact part 6 of the metal terminal 4 are electrically and mechanically connected and fixed to each other, to complete the aforementioned electronic component 1.

Figure 4:
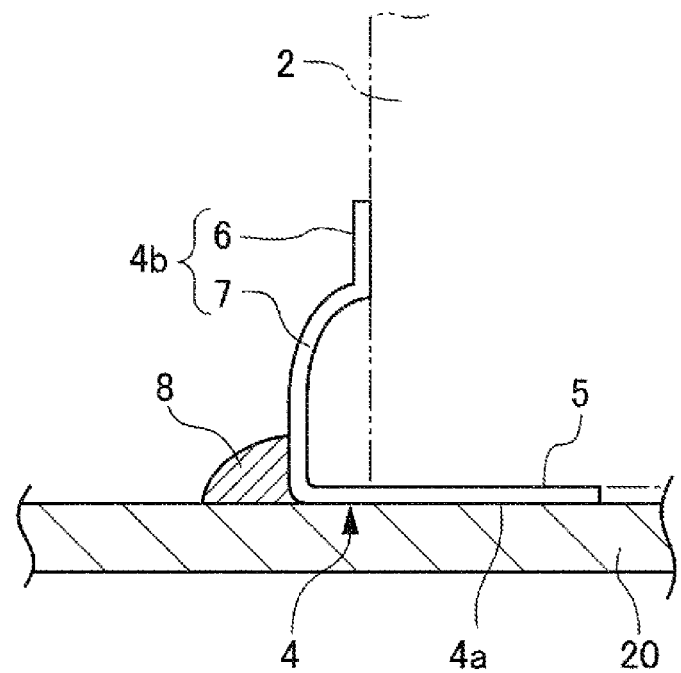
[FIG. 4] is a drawing explaining a variation example of the metal terminal shape of the aforementioned electronic component, and structure of how it is soldered onto the mounting side of the circuit board.
Figure 5:
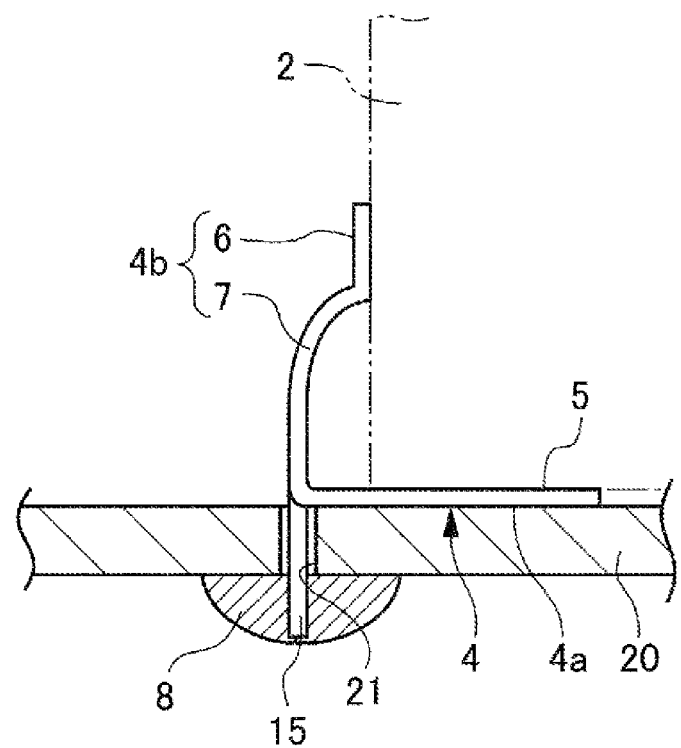
[FIG. 5] is a drawing explaining another variation example of the metal terminal shape of the aforementioned electronic component, and structure of how it is soldered onto the mounting side of the circuit board.

While the lead terminal 4b of the metal terminal 4 is extending upward from the lateral center of the horizontal part 4a in the structure shown in the above example, the lead terminal 4b may be formed by bending one end of the horizontal part 4a so as to form a lead terminal shape roughly in an L shape, for example, as shown in FIG. 4. In this case, connection with the circuit board 20 is implemented by fixing the base part of the lead terminal 4b onto the mounting side by solder, brazing material, or other bonding material 8, for mounting onto the circuit board 20.

Also, in a different structure, the horizontal part 4a may be provided horizontally toward the inside from the vertical center of the lead terminal 4b, to form a lead terminal shape roughly in an L shape as a whole. In this case, connection with the circuit board 20 is implemented by inserting into a through hole 21 in the circuit board 20 a downward projection part 15 of the lead terminal 4b that extends to below the horizontal part 4a, and then fixing it at the back of the circuit board 20 using solder or bonding material 8 such as brazing material, for mounting onto the circuit board 20.

In other words, the metal terminal 4 used under the present invention needs to have at least an L-shaped lead terminal 4b that electrically and mechanically connects and fixes to the horizontal part 4a and end face 2d contacting the bottom face 2b of the electronic component element.

In addition, the present invention is not limited to the aforementioned embodiment, but it also includes variations, improvements, etc., to the extent that the object of the present invention can be achieved.

DESCRIPTION OF THE SYMBOLS

1: Electronic component; 2: Electronic component element; 2a: Top face; 2b: Bottom face; 2c: Side face; 2d: End face; 3: External electrode; 4: Metal terminal; 4a: Horizontal part; 4b: Lead terminal; 5: Bottom contact part; 6: Connection part; 7: Lead; 8: Bonding material; 14a: Inner part; 14b: Outer part; 15: Downward projection part; 20: Circuit board; 21: Through hole; G: Center of gravity

What is claimed is:

1. An electronic component comprising:
   an electronic component element having a top face, a bottom face, a pair of side faces, and a pair of end faces as well as a pair of external electrodes provided on the pair of end faces; and
   a pair of metal terminals respectively connected to the pair of external electrodes on the electronic component element;
   wherein each metal terminal is constituted by: a lead terminal whose one end is electrically and mechanically connected to the external electrode on the electronic component element; and a plate-shaped horizontal part to which another end of the lead terminal is connected and which also has a bottom contact part in contact with the bottom face of the electronic component element, wherein the lead terminal includes a part formed between the one end and the other end as a lead facing the external electrode, said lead being capable of undergoing flexural deformation by bending,
   wherein the plate-shaped horizontal part of the metal terminal is not bonded to the bottom face of the electronic component element, and the other end of the lead terminal and an outer periphery of the bottom contact part facing the other end of the lead terminal on the plate-shaped horizontal part are apart from each other in a manner assuring mobility of the electronic component element with respect to the plate-shaped horizontal part.

2. An electronic component according to claim 1, wherein a center of gravity of the metal terminal is positioned inside the electronic component element as viewed from above.

3. An electronic component according to claim 1, wherein the metal terminal is press-formed as one piece.

4. An electronic component according to claim 1, which is a multi-layer ceramic capacitor.

5. An electronic component according to claim 1, wherein the metal terminal is L-shaped constituted by the lead terminal and the horizontal part as viewed from side.

6. An electronic component according to claim 1, wherein the metal terminal further comprises a downward projection part projecting from the horizontal part in a direction opposite to the lead terminal, said downward projection part being adapted to be inserted into a through hole of a circuit board on which the electronic component is to be mounted.

7. A circuit board on which an electronic component of claim 1 is mounted, wherein the plate-shaped horizontal part of the metal terminal is bonded to the circuit board but is not bonded to the bottom face of the electronic component element such that flexural deformation occurs between the circuit board and a connection part where the metal terminal is connected to the external electrode when disturbance stress is exerted on the electronic component.

8. A circuit board according to claim 7, wherein a center of gravity of the metal terminal is positioned inside the electronic component element as viewed from above.

* * * * *